United States Patent
Park et al.

(10) Patent No.: US 7,297,584 B2
(45) Date of Patent: Nov. 20, 2007

(54) METHODS OF FABRICATING SEMICONDUCTOR DEVICES HAVING A DUAL STRESS LINER

(75) Inventors: Jae-Eon Park, Gyeonggi-do (KR);
Ja-Hum Ku, Gyeonggi-do (KR);
Jun-Jung Kim, Gyeonggi-do (KR);
Dae-Kwon Kang, Gyeonggi-do (KR);
Young Way Teh, Singapore (SG)

(73) Assignees: Samsung Electronics Co., Ltd. (KR);
Chartered Semiconductor Manufacturing, Ltd., Singapore (SG)

( * ) Notice: Subject to any disclaimer, the term of this patent is extended or adjusted under 35 U.S.C. 154(b) by 46 days.

(21) Appl. No.: 11/246,471

(22) Filed: Oct. 7, 2005

(65) Prior Publication Data

US 2007/0082439 A1 Apr. 12, 2007

(51) Int. Cl.
*H01L 21/8234* (2006.01)
*H01L 21/8238* (2006.01)
*H01L 21/336* (2006.01)

(52) U.S. Cl. ............. 438/199; 438/197; 438/224; 438/201; 438/202; 438/207; 438/217; 257/368; 257/351; 257/347; 257/369; 257/E21.632; 257/E21.64

(58) Field of Classification Search ........ 438/197, 438/199, 224, 201–202, 207, 217; 257/368, 257/351, 347, 369
See application file for complete search history.

(56) References Cited

U.S. PATENT DOCUMENTS

| | | | |
|---|---|---|---|
| 7,022,561 B2* | 4/2006 | Huang et al. | 438/197 |
| 7,189,624 B2* | 3/2007 | Ito | 438/308 |
| 2003/0040158 A1* | 2/2003 | Saitoh | 438/279 |
| 2005/0098829 A1* | 5/2005 | Doris et al. | 257/351 |
| 2005/0199963 A1* | 9/2005 | Aoyama | 257/369 |
| 2005/0218455 A1* | 10/2005 | Maeda et al. | 257/368 |
| 2005/0230756 A1* | 10/2005 | Chang et al. | 257/351 |
| 2006/0019438 A1* | 1/2006 | Harakawa | 438/199 |
| 2006/0118879 A1* | 6/2006 | Li | 257/369 |

(Continued)

FOREIGN PATENT DOCUMENTS

JP 2003-060076 A 2/2003

(Continued)

OTHER PUBLICATIONS

"Notice to Submit Response," issued by the Korean Intellectual Property Office on Nov. 24, 2006, corresponding to Korean Patent Application No. 10-2005-113411.

*Primary Examiner*—Michael Lebentritt
*Assistant Examiner*—Ahmadi Mohsen
(74) *Attorney, Agent, or Firm*—Myers Bigel Sibley & Sajovec, PA

(57) ABSTRACT

In a semiconductor device having a dual stress liner for improving electron mobility, the dual stress liner includes a first liner portion formed on a PMOSFET and a second liner portion formed on an NMOSFET. The first liner portion has a first compressive stress, and the second liner portion has a second compressive stress smaller than the first compressive stress. The dual stress liner may be formed by forming a stress liner on a semiconductor substrate on which the PMOSFET and the NMOSFET are formed and selectively exposing a portion of the stress liner on the NMOSFET.

12 Claims, 15 Drawing Sheets

U.S. PATENT DOCUMENTS

2006/0157795 A1* 7/2006 Chen et al. .................. 257/369
2006/0246672 A1* 11/2006 Chen et al. .................. 438/301
2007/0018328 A1* 1/2007 Hierlemann et al. ........ 257/762

FOREIGN PATENT DOCUMENTS

| JP | 2003-179225 | 6/2003 |
| KR | 2005-27851 | 3/2005 |
| KR | 10-2005-0096386 A | 10/2005 |

* cited by examiner

METHODS OF FABRICATING SEMICONDUCTOR DEVICES HAVING A DUAL STRESS LINER

BACKGROUND OF THE INVENTION

1. Field of the Invention

The present invention relates to a semiconductor device having a dual stress liner, a method of manufacturing the semiconductor device and a light exposure apparatus for forming the dual stress liner. More particularly, the present invention relates to a semiconductor device having a dual stress liner for increasing electron mobility, a method of manufacturing the semiconductor device, and a light exposure apparatus for forming the dual stress liner.

2. Description of the Related Art

A semiconductor device including a PMOSFET (p-channel metal oxide semiconductor field effect transistor) and an NMOSFET (n-channel metal oxide semiconductor field effect transistor) may be manufactured by repeatedly performing unit manufacturing processes, such as a film formation, an etching, an ion implantation, or the like, on a semiconductor substrate such as a silicon wafer.

Electron mobility may be decreased by the compressive stress applied to the semiconductor substrate while repeatedly performing the unit manufacturing processes. In detail, the compressive stress occurs in channel regions of the MOSFETs due to the difference of thermal expansion coefficients of materials constituting the semiconductor device and the actual or genuine stress existing in the materials. Thus, the electron mobility and saturation drain current ($I_{dsat}$) are decreased in the NMOSFET, which uses electrons as its carrier.

Meanwhile, according to U.S. patent application Publication Ser. No. 2003/0040158, in a semiconductor device including an n-channel MOSFET and a p-channel MOSFET, a first silicon nitride layer having tensile stress is formed on the n-channel MOSFET, and a second silicon nitride layer having compressive stress is formed on the p-channel MOSFET. Thus, electron mobility and saturation drain current of the n-channel MOSFET are increased, and bending or warping of a substrate is reduced.

FIGS. 1 to 5 are cross-sectional views illustrating a conventional method of manufacturing a semiconductor device.

Referring to FIG. 1, a PMOSFET 20a and an NMOSFET 20b are formed on active regions defined by an isolation layer 12 formed in a surface portion of a single crystal silicon substrate 10. The PMOSFET 20a includes a gate insulating layer 22a, a gate electrode 24a, spacers 26a and impurity diffusion regions 28a which serve as source/drain regions of the PMOSFET 20a. The NMOSFET 20b includes a gate insulating layer 22b, a gate electrode 24b, spacers 26b and impurity diffusion regions 28b which serve as source/drain regions of the NMOSFET 20b. Metal silicide layers 30a and 30b are formed in top portions of the gate electrodes 24a and 24b and surface portions of the impurity diffusion regions 28a and 28b.

Referring to FIG. 2, a first silicon nitride layer 40 having compressive stress is formed on the PMOSFET 20a and the NMOSFET 20b using a plasma enhanced chemical vapor deposition (PECVD) process, and then a first photoresist pattern 42 is formed on the first silicon nitride layer 40. The first photoresist pattern 42 exposes a portion of the first silicon nitride layer 40 on the NMOSFET 20b.

Referring to FIG. 3, the NMOSFET 20b is exposed by selectively removing the first silicon nitride layer 40 using the first photoresist pattern 42 as an etching mask. Then, a second silicon nitride layer 44 having tensile stress is formed on the NMOSFET 20b and the first silicon nitride layer 40 using a low pressure chemical vapor deposition (LPCVD) process after removing the first photoresist pattern 42 from the substrate 10.

Referring to FIG. 4, a second photoresist pattern 46 is formed on the second silicon nitride layer 44. The second photoresist pattern 46 is formed to selectively expose a portion of the second silicon nitride layer 44 on the PMOSFET 20a.

Referring to FIG. 5, the first silicon nitride layer 40 is exposed by selectively removing the second silicon nitride layer 44 using the second photoresist pattern 46 as an etching mask. Then, the second photoresist pattern 46 is removed from the substrate 10.

The silicon nitride layers 40 and 44 formed through the above-described processing steps may increase electron mobility of the NMOSFET 20b and improve stability of the semiconductor substrate 10. However, the conventional method has some drawbacks. Particularly, the processing steps for forming the silicon nitride layers 40 and 44 are complicated, and thus a long time for forming the silicon nitride layers 40 and 44 is required. Accordingly, the fabricating time of the semiconductor is increased, and thus the productivity of the semiconductor is deteriorated.

SUMMARY OF THE INVENTION

Exemplary embodiments of the present invention provide a semiconductor device having a dual stress liner, which may be manufactured through simple processing steps, a method of manufacturing the semiconductor device, and a light exposure apparatus for forming the dual stress liner.

An exemplary embodiment of the present invention may provide a semiconductor device including a substrate, a PMOSFET formed on the substrate, an NMOSFET formed on the substrate, and a dual stress liner including a first portion formed on the PMOSFET and a second portion formed on the NMOSFET. The first portion has a first stress, and the second portion has a second stress smaller than the first stress.

In exemplary embodiments of the present invention, each of the PMOSFET and the NMOSFET may include a gate insulating layer formed on the substrate, a gate electrode formed on the gate insulating layer, and impurity regions to be used as source/drain regions, which are formed at surface portions of the substrate adjacent to the gate electrode. Each of the PMOSFET and the NMOSFET may further include silicide layers formed in a top portion of the gate electrode and surface portions of the impurity regions.

The first stress may be a first compressive stress, and the second stress may be a second compressive stress smaller than the first compressive stress. The dual stress liner may include silicon nitride formed using a plasma enhanced chemical vapor deposition process.

Another exemplary embodiment of the present invention may provide a method of manufacturing a semiconductor device. A PMOSFET and an NMOSFET are formed on a substrate. A dual stress liner includes a first portion having a first stress and a second portion having a second stress smaller than the first stress. The first portion is formed on the PMOSFET, and the second portion is formed on the NMOSFET.

In exemplary embodiments of the present invention, the dual stress liner may be formed by forming a stress liner on the PMOSFET and the NMOSFET and relaxing a stress of a portion of the stress liner formed on the NMOSFET. The dual stress liner may include silicon nitride formed by a plasma enhanced chemical vapor deposition process.

The stress of the portion of the stress liner on the NMOSFET may be relaxed by selectively exposing the portion of the stress liner on the NMOSFET to an ultraviolet light using a light exposure apparatus having a photomask for selectively exposing the portion of the stress liner on the NMOSFET to the ultraviolet light. The substrate may be heated to a temperature of about 400° C. to about 550° C. while exposing the portion of the stress on the NMOSFET to the ultraviolet light. The stress relaxation of the stress liner may be performed in a vacuum chamber.

Still another exemplary embodiment of the present invention may provide a method of manufacturing a semiconductor device. A PMOSFET and an NMOSFET are formed on a substrate. A stress liner having a first stress is formed on the PMOSFET and the NMOSFET. A portion of the stress liner on the NMOSFET is selectively exposed to an ultraviolet light so that the portion of the stress liner on the NMOSFET has a second stress smaller than the first stress.

Still another exemplary embodiment of the present invention may provide a light exposure apparatus including a stage for supporting a substrate, wherein a PMOSFET and an NMOSFET are formed on the substrate, and a stress liner having a first stress is formed on the PMOSFET and the NMOSFET, a photomask having a light transmitting section corresponding to a portion of the stress liner on the NMOSFET, an illumination optical system for illuminating the photomask with an illumination light, and a projection optical system for exposing the portion of the stress liner on the NMOSFET to a projection light transmitted through the light transmitting section so that the portion of the stress liner on the NMOSFET has a second stress smaller than the first stress.

In exemplary embodiments of the present invention, the light exposure apparatus may further include a heater for the substrate and a vacuum chamber for receiving the stage. The illumination light may include an ultraviolet light.

According to the exemplary embodiments of the present invention, the dual stress liner may be easily formed by the formation of the stress liner and the selective ultraviolet light exposure. Thus, the time required for forming the dual stress liner may be shortened, and thus the productivity of the semiconductor device may be improved.

BRIEF DESCRIPTION OF THE DRAWINGS

Exemplary embodiments of the present invention will become readily apparent along with the following detailed description when considered in conjunction with the accompanying drawings wherein.

DESCRIPTION OF THE INVENTION

Figure 1:
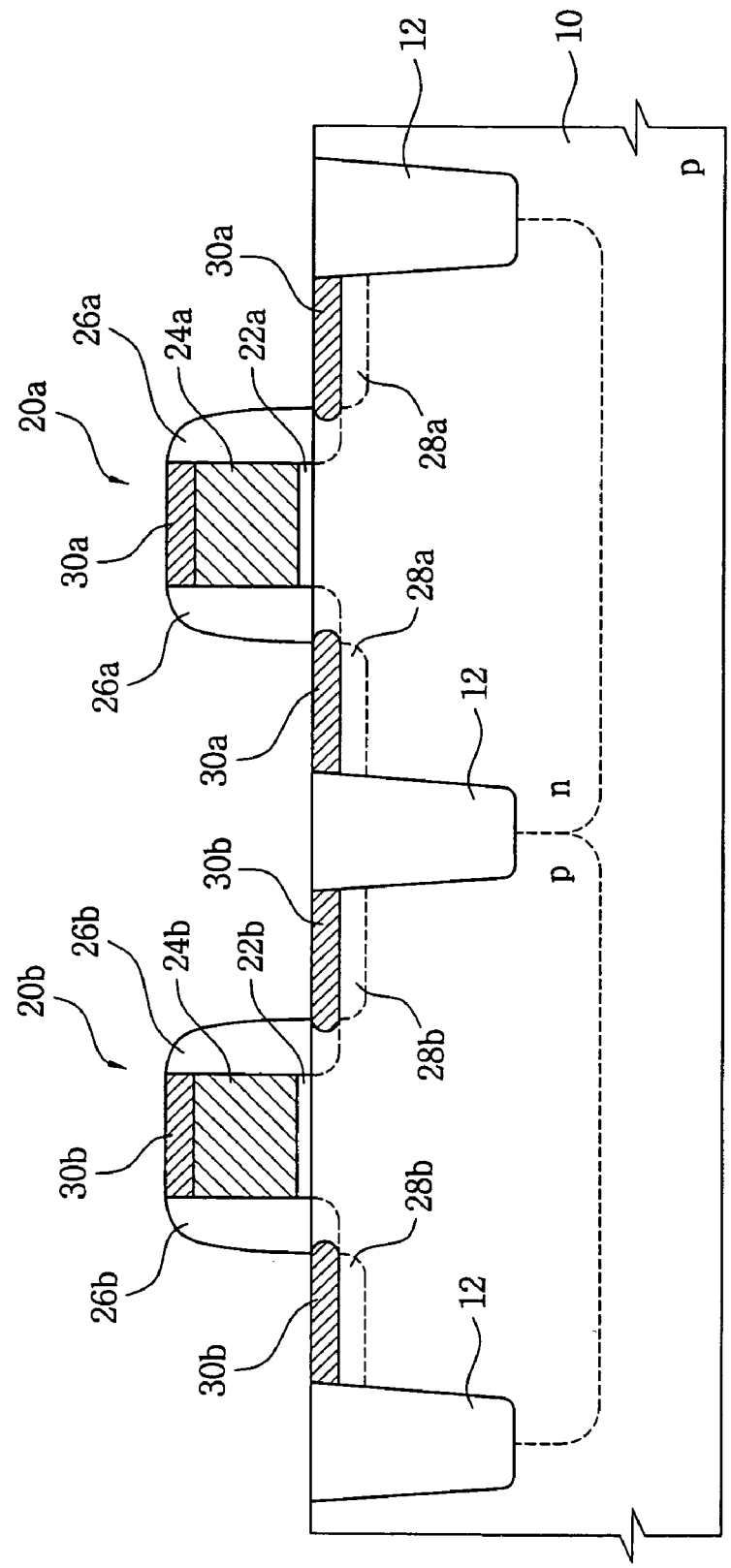
FIGS. 1 to 5 are cross-sectional views illustrating a conventional method of manufacturing a semiconductor device.
Figure 2:
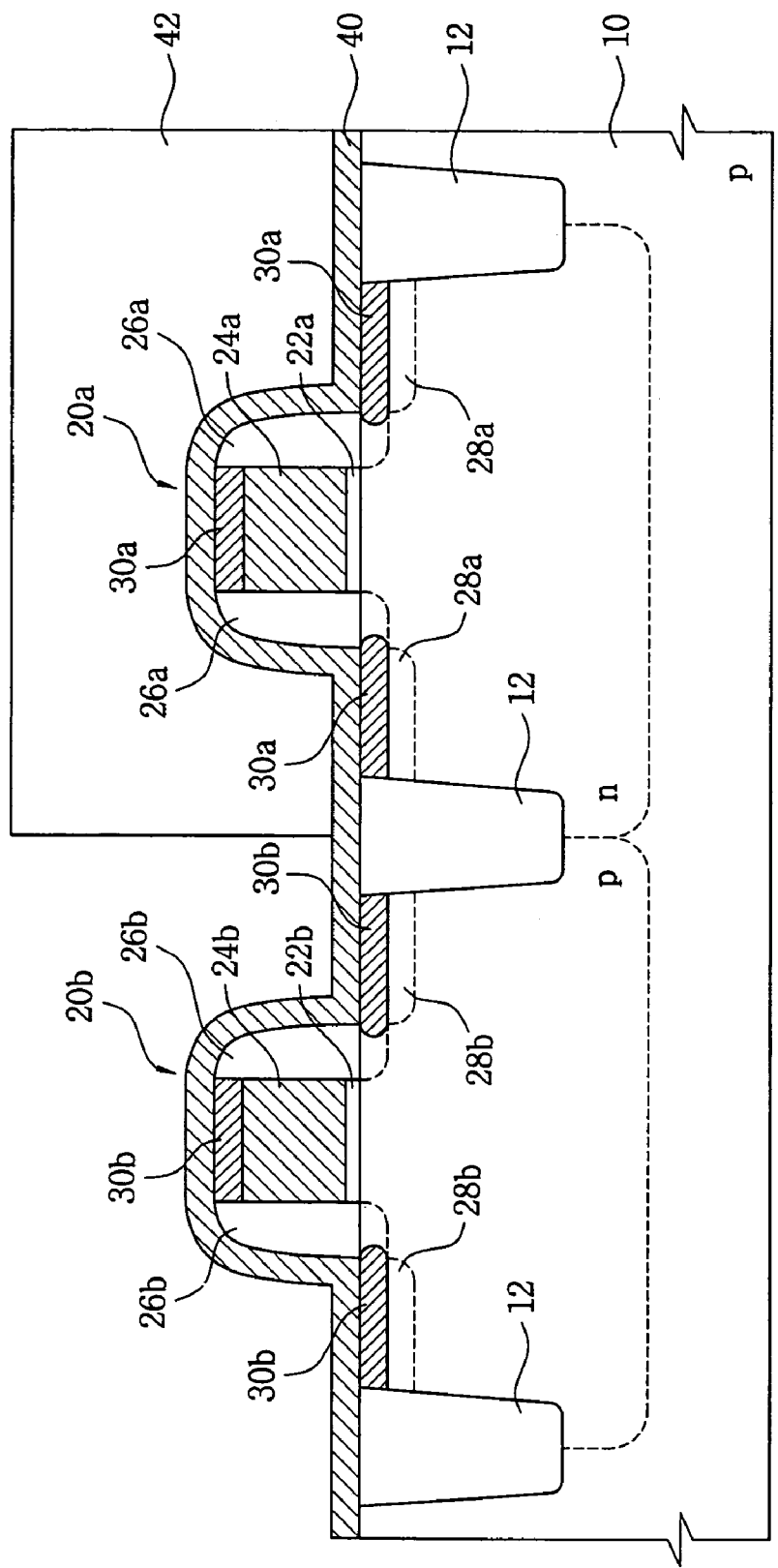
Figure 3:
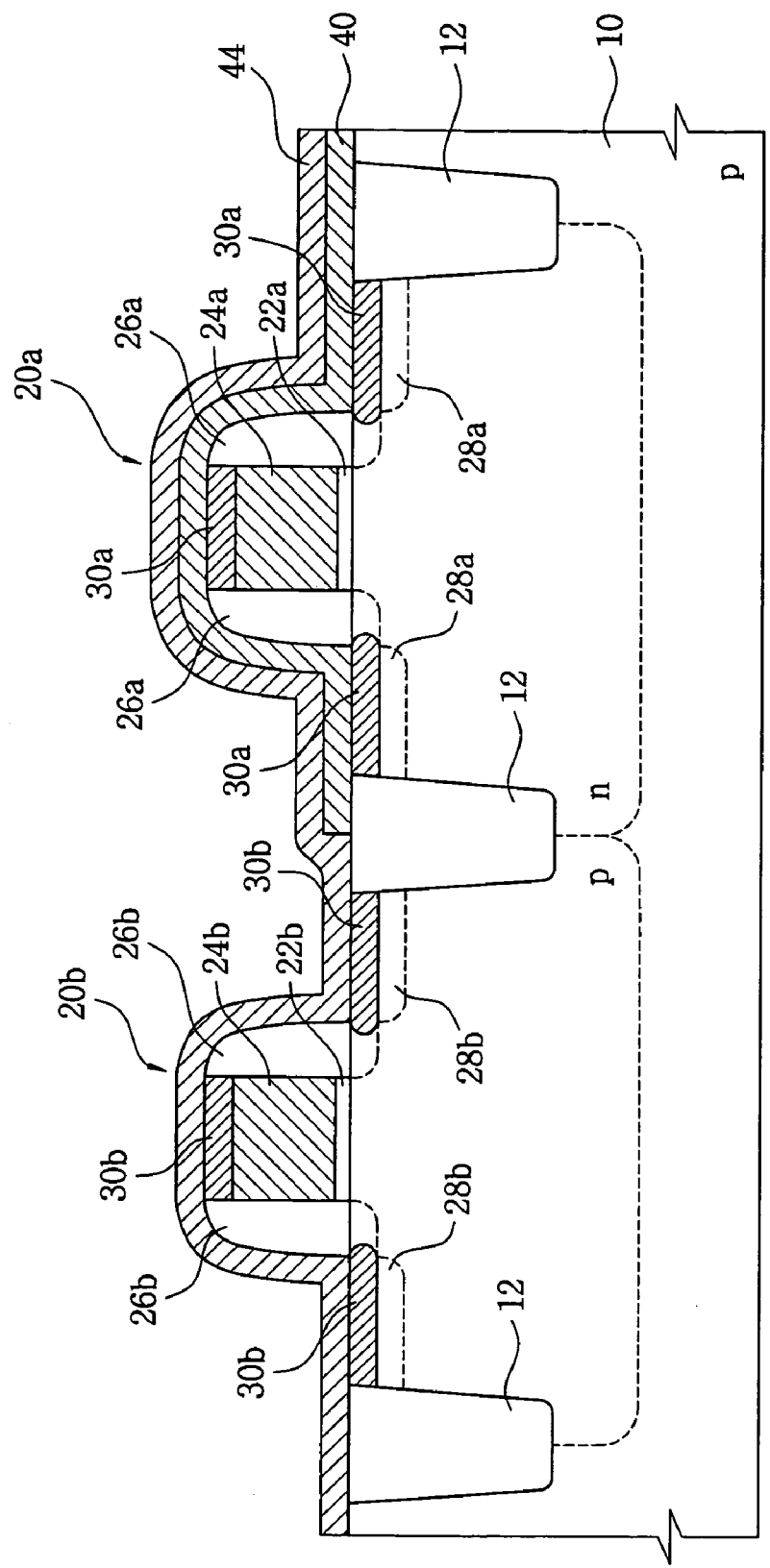
Figure 4:
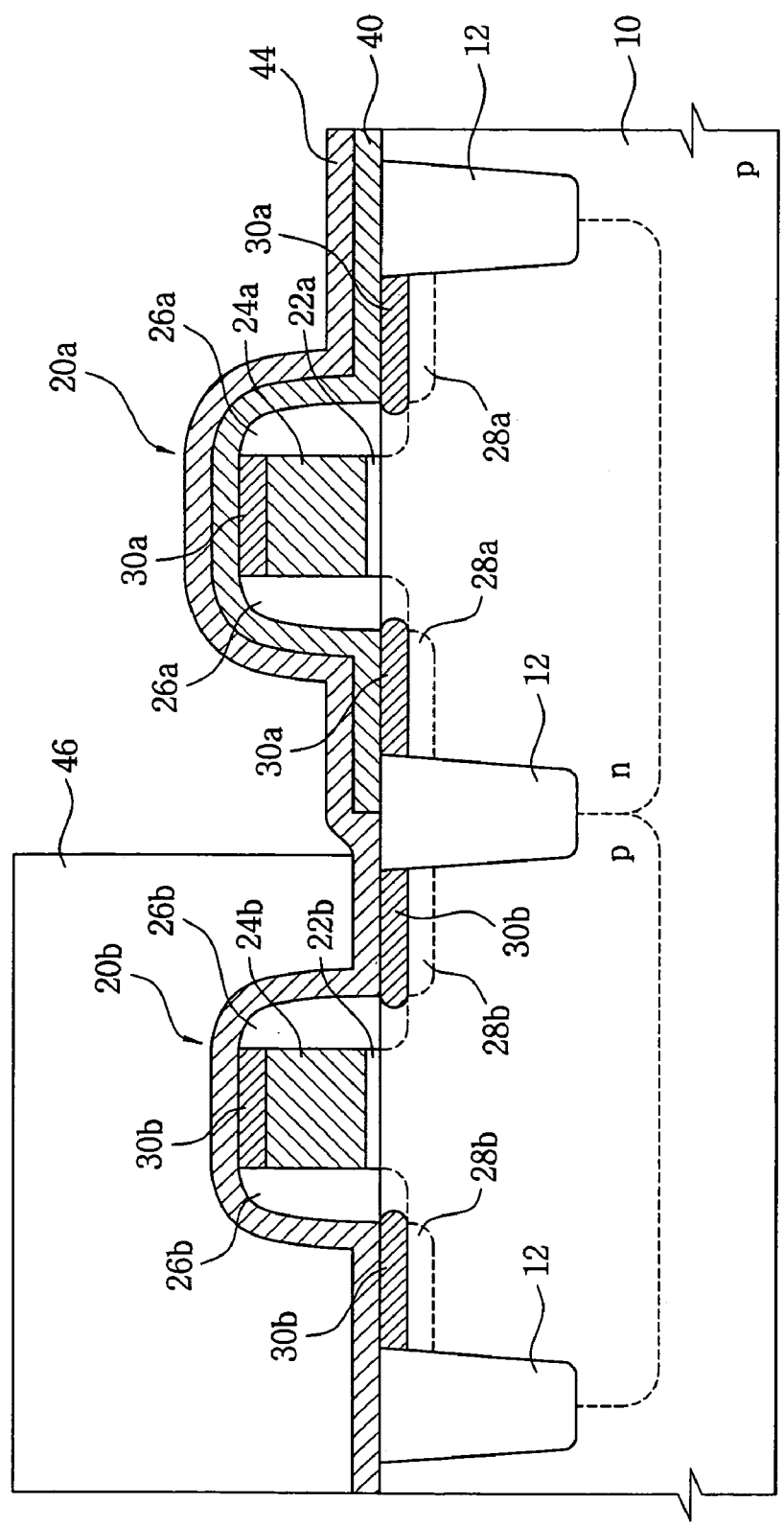
Figure 5:
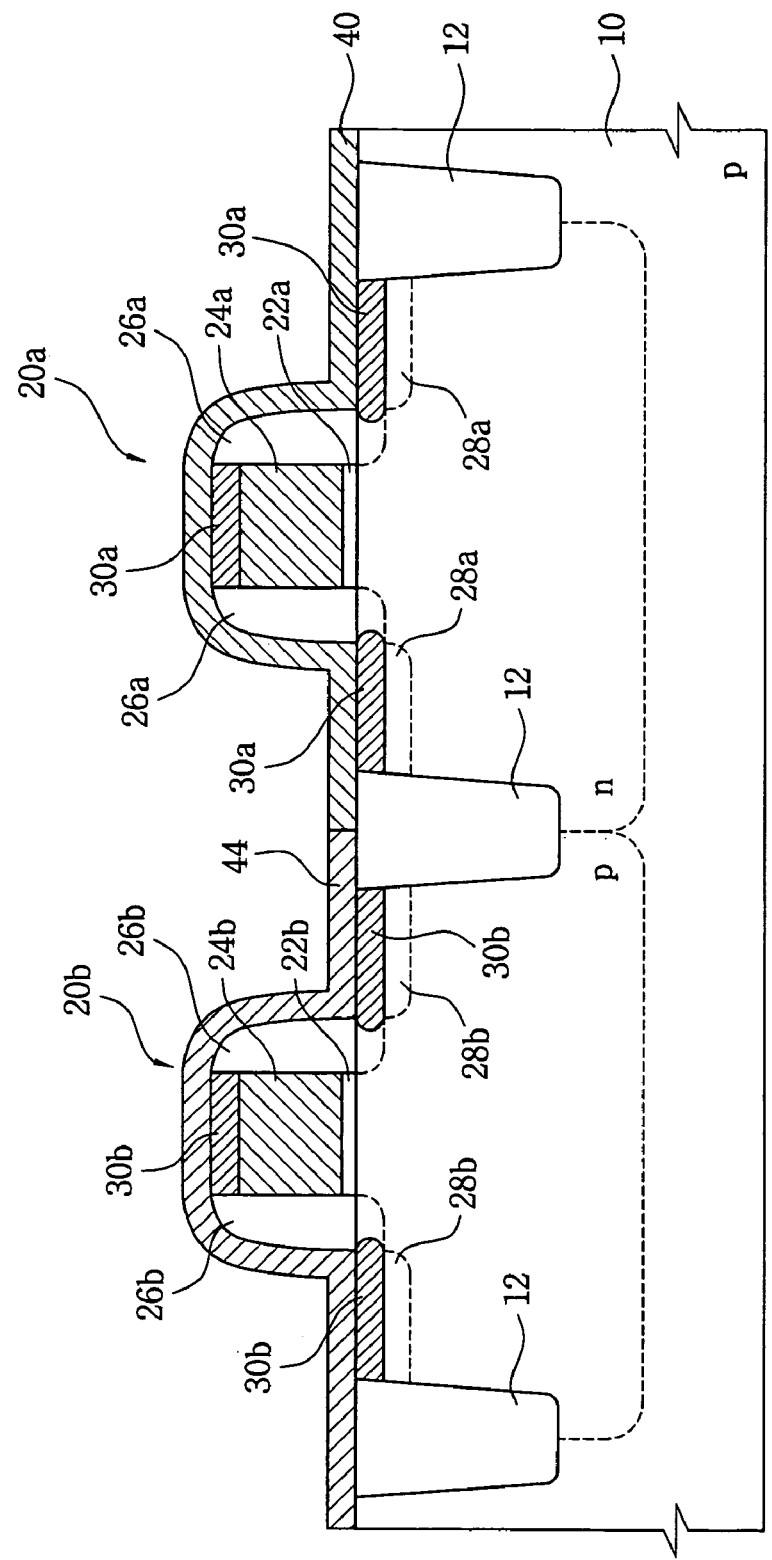

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Figure 6:
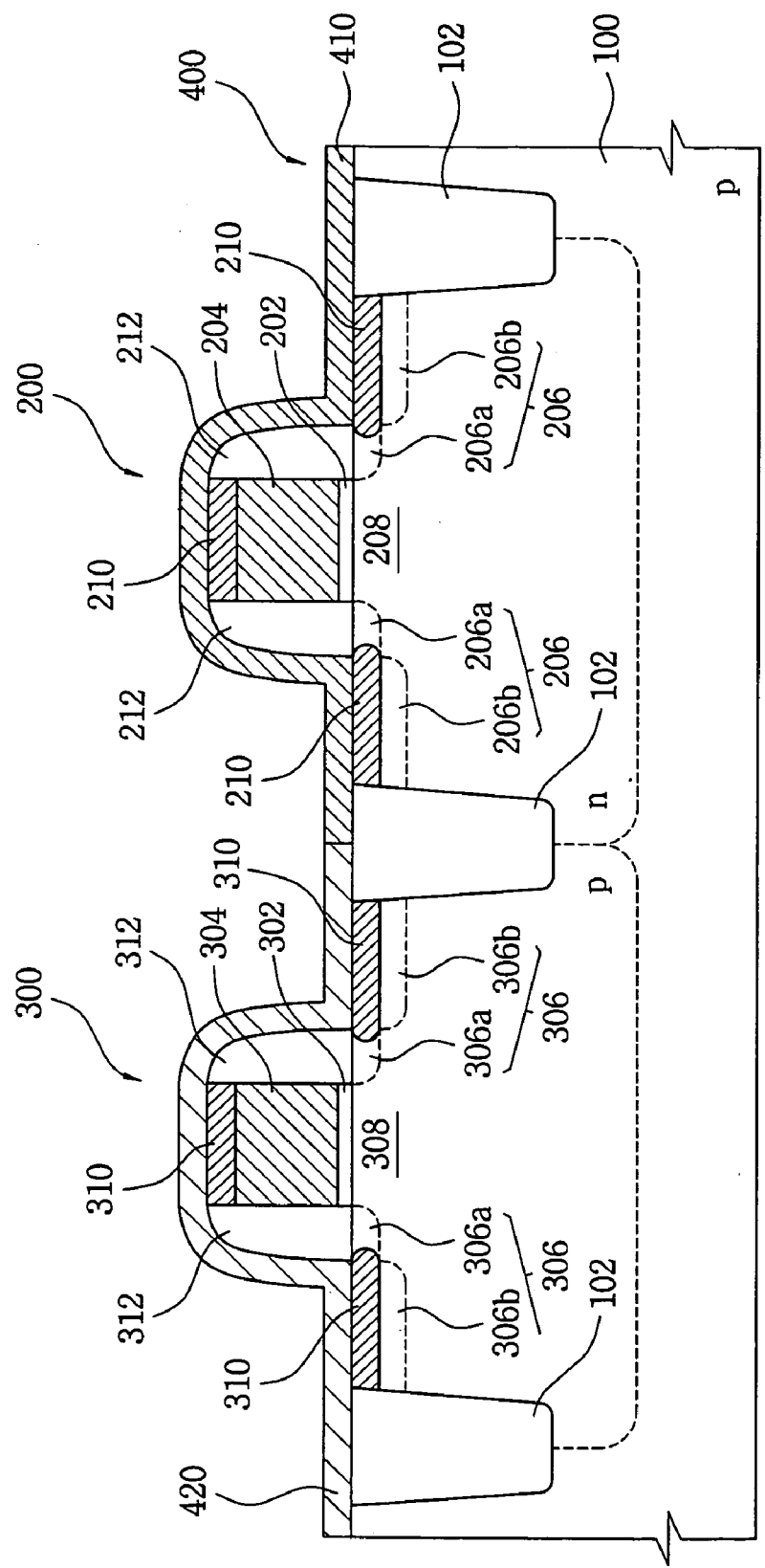
FIG. 6 is a cross-sectional view illustrating a semiconductor device having a dual stress liner in accordance with an exemplary embodiment of the present invention.

FIG. 6 is a cross-sectional view illustrating a semiconductor device having a dual stress liner in accordance with an exemplary embodiment of the present invention.

Referring to FIG. 6, a semiconductor device includes a semiconductor substrate 100, such as a p-type single crystal silicon wafer, and a PMOSFET 200 and an NMOSFET 300 formed on the semiconductor substrate 100.

The semiconductor substrate 100 has active regions defined by a device isolation layer 102, and the PMOSFET 200 and the NMOSFET 300 are formed on the active regions. An n-type well is formed in the active region for the PMOSFET 200, and a p-type well is formed in the active region for the NMOSFET 300.

The PMOSFET 200 may include a first gate insulating layer 202, a first gate electrode 204, p-type impurity regions 206 to be used as source/drain regions and a first channel region 208 underneath the first gate insulating layer 202. The NMOSFET 300 may include a second gate insulating layer 302, a second gate electrode 304, n-type impurity regions 306 to be used as source/drain regions and a second channel region 308 underneath the second gate insulating layer 302.

The p-type impurity regions 206 and the n-type impurity regions 306 may include low impurity regions 206a and 306a and high impurity regions 206b and 306b, respectively.

The first gate electrode 204 and the second gate electrode 304 may include impurity-doped polysilicon. In detail, the first gate electrode 204 may include p-type impurity doped polysilicon, and the second gate electrode 304 may include n-type impurity doped polysilicon.

Metal silicide layers 210 and 310 may be formed on top portions of the first and second gate electrodes 204 and 304 and surface portions of the p-type and n-type impurity diffusion regions 206 and 306. For example, cobalt silicide layers or titanium silicide layers may be formed on the top portions of the first and second gate electrodes 204 and 304 and the surface portions of the p-type and n-type impurity diffusion regions 206 and 306.

Spacers 212 and 312 including silicon oxide or silicon nitride may be formed on side surfaces of the first and second gate electrodes 204 and 304.

Structures of the above-described MOSFETs 200 and 300 may be variably changed or modified, and thus the spirit and scope of the present invention are not limited by the structures of the MOSFETs 200 and 300.

A dual stress liner 400 having a first stress and a second stress is formed on the PMOSFET 200 and the NMOSFET 300. The dual stress liner 400 is formed to increase electron mobility of the NMOSFET 300 and improve stability of the semiconductor substrate 100.

In detail, the dual stress liner 400 may include a first liner portion 410 having a first compressive stress and a second liner portion 420 having a second compressive stress smaller than the first compressive stress. The first liner portion 410 is formed on the PMOSFET 200, and the second liner portion 420 is formed on the NMOSFET 300.

The electron mobility of the NMOSFET 300 may be increased by the second liner portion 420. Particularly, the second liner portion 420 has the second compressive stress small enough to relax compressive stress applied to the second channel region 308 of the NMOSFET 300. Thus, the electron mobility, saturation drain current and current driving capability of the NMOSFET 300 may be increased.

Indeed, a plurality of PMOSFETs and a plurality of NMOSFETs are formed on the substrate 100, and a plurality of first liner portions and a plurality of second liner portions are successively formed on the PMOSFETs and the NMOSFETs. Thus, bending and/or warping of the semiconductor substrate 100 may be reduced, and thus the stability of the semiconductor substrate 100 may be improved.

The dual stress liner 400 may include silicon nitride, and may be formed by a plasma enhanced chemical vapor deposition (PECVD) process and a selective ultraviolet light exposure process. Particularly, the dual stress liner 400 may be formed by forming a silicon nitride layer on the PMOSFET 200 and the NMOSFET 300 using the PECVD process and selectively exposing a portion of the silicon nitride layer on the NMOSFET 300 to ultraviolet light. In the PECVD process, hydrogen (H) is introduced in the silicon nitride layer, and as a result, actual compressive stress is generated in the silicon nitride layer. The compressive stress of the silicon nitride layer may be relaxed through the selective ultraviolet light exposure process.

FIGS. 7 to 13 are cross-sectional views illustrating a method of manufacturing the semiconductor device as shown in FIG. 6.

Figure 7:
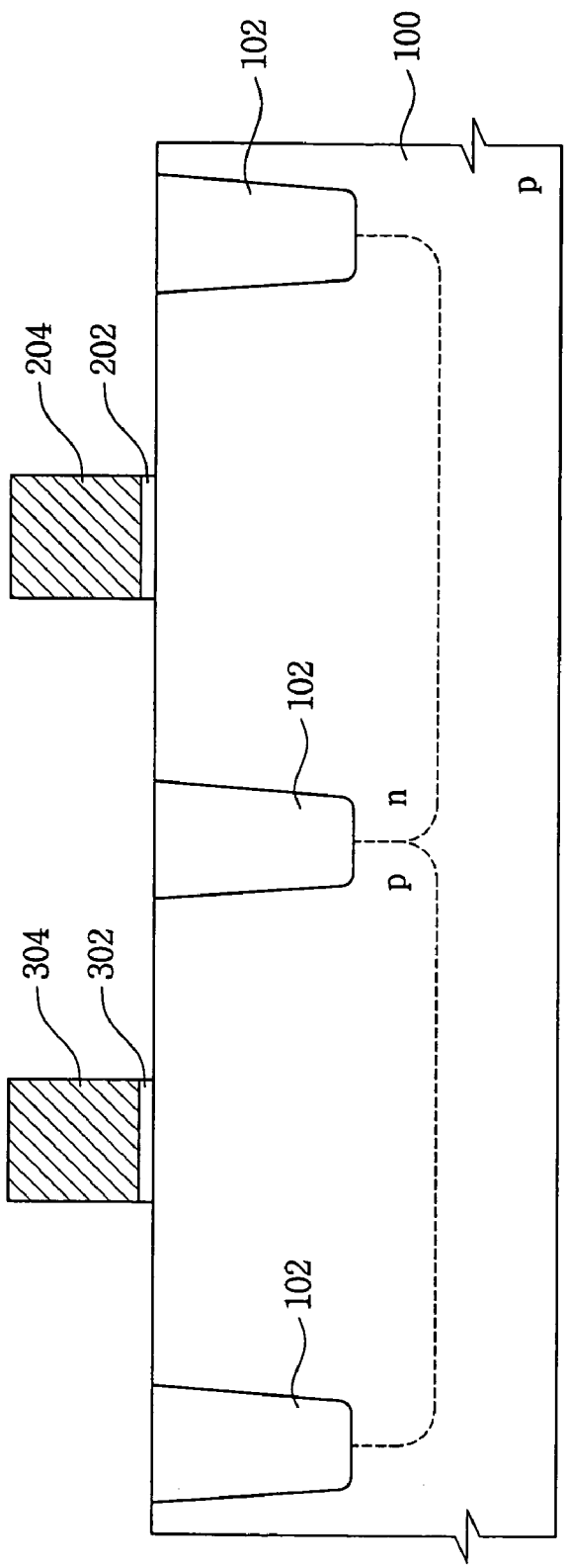
FIGS. 7 to 13 are cross-sectional views illustrating a method of manufacturing the semiconductor device as shown in FIG. 6.

Referring to FIG. 7, active regions are defined by forming a device isolation layer 102 in a surface portion of a semiconductor device 100 such as a p-type single crystal silicon wafer using a shallow trench isolation (STI) process.

An n-type well is formed in the active region for a PMOSFET, and a p-type well is formed in the active region for an NMOSFET. The n-type well and the p-type well may be formed by an ion implantation process. Particularly, the n-type well may be formed by selectively implanting n-type impurities into the active region for the PMOSFET, and the p-type well may be formed by selectively implanting p-type impurities into the active region for the NMOSFET.

A silicon oxide layer for gate insulating layers 202 and 302 is formed on a whole surface of the semiconductor substrate 100 using a thermal oxidation process, and then a polysilicon layer for gate electrode 204 and 304 is formed on the silicon oxide layer using a low pressure chemical vapor deposition (LPCVD) process. Furthermore, the polysilicon layer is selectively doped with p-type and n-type impurities. For example, the p-type impurities may be implanted into a portion of the polysilicon layer on the n-type well, and the n-type impurities may be implanted into a portion of the polysilicon layer on the p-type well.

The polysilicon layer and the silicon oxide layer are patterned through an anisotropic etching process so that the first gate electrode 204 and the first gate insulating layer 202 are formed on the n-type well, and the second gate electrode 304 and the second gate insulating layer 302 are formed on the p-type well.

Figure 8:
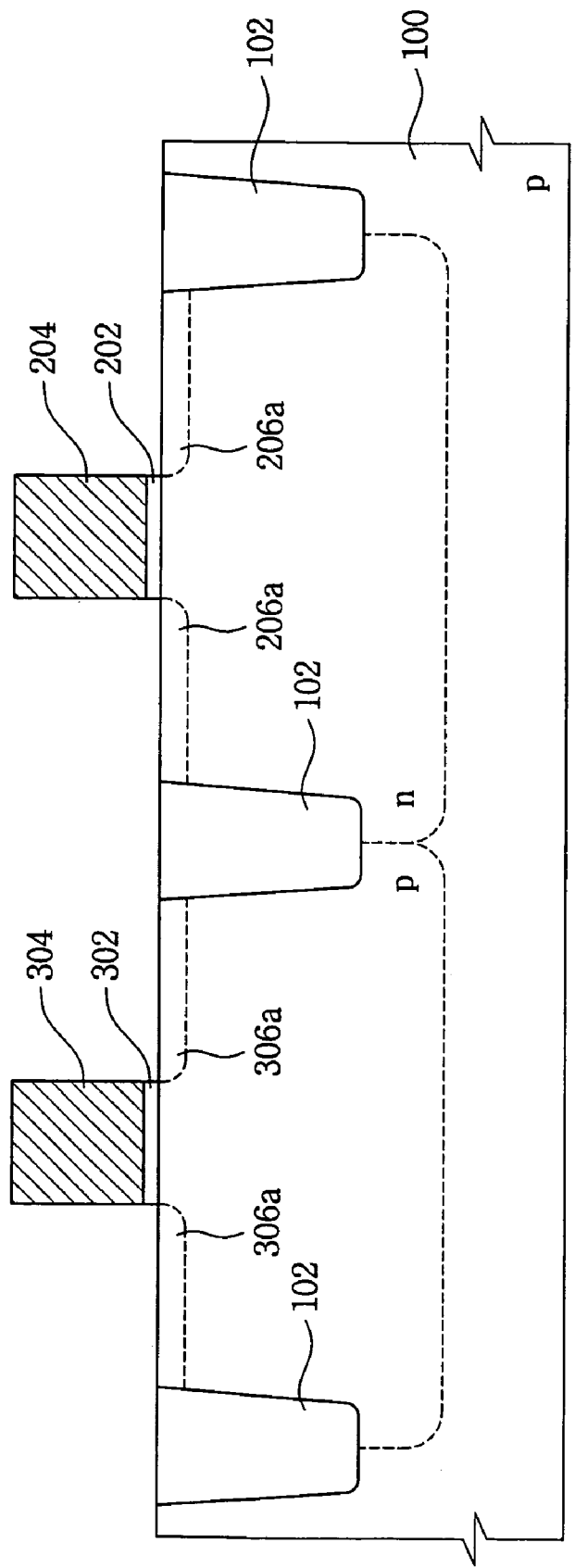

Referring to FIG. 8, a photoresist pattern (not shown) is formed on the active regions, and has an opening to expose the active region for the PMOSFET. P-type low density impurity regions 206a are formed at surface portions of the active region adjacent to the first gate electrode 204 by selectively implanting the p-type impurities, using the photoresist pattern and the first gate electrode 204 as an ion implant mask. The photoresist pattern is removed from the semiconductor substrate 100 after forming the p-type low density impurity regions 206a.

Similarly, a photoresist pattern (not shown) is formed on the active regions, and has an opening to expose the active region for the NMOSFET. N-type low density impurity regions 306a are formed at surface portions of the active region adjacent to the second gate electrode 304 by selectively implanting the n-type impurities, using the photoresist pattern and the second gate electrode 304 as an ion implant mask. The photoresist pattern is removed from the semiconductor substrate 100 after forming the n-type low density impurity regions 306a.

Figure 9:
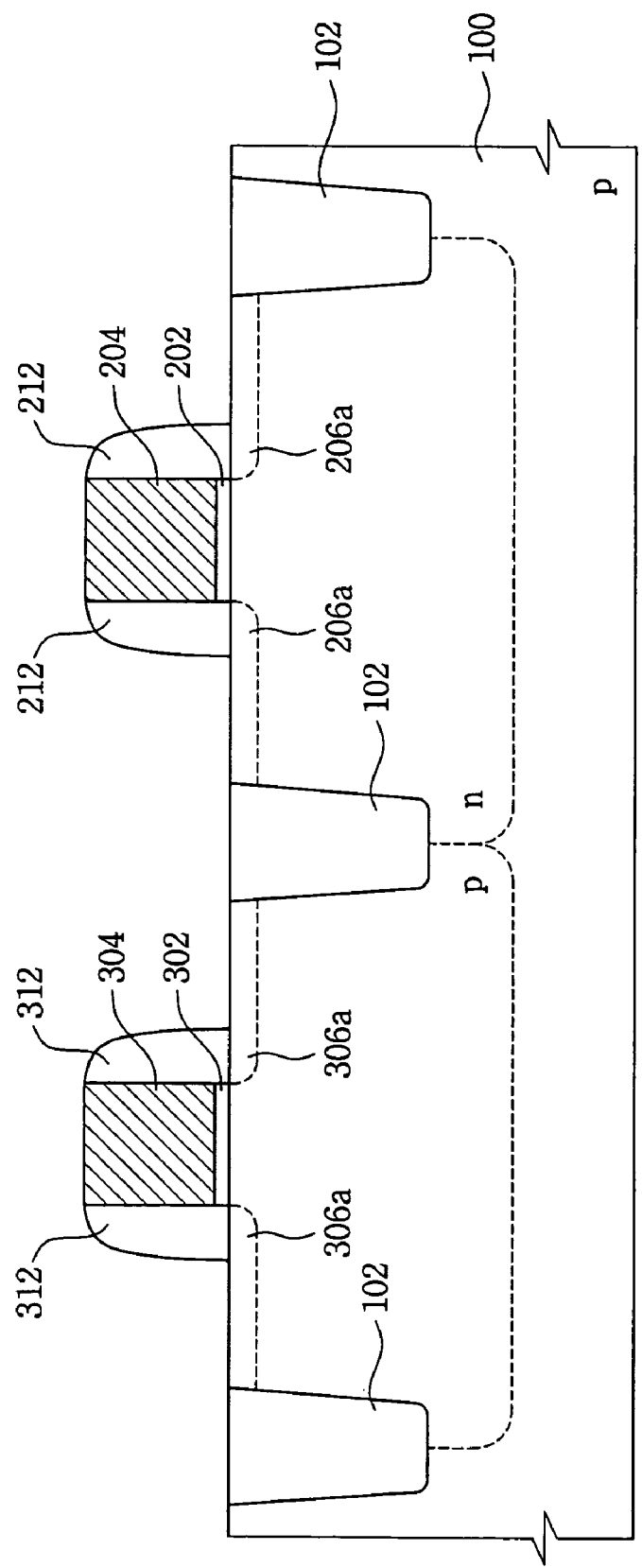

Referring to FIG. 9, spacers 212 and 312 are formed on side surfaces of the first and second gate electrodes 204 and 304. The spacers 212 and 312 may include silicon oxide or silicon nitride.

Particularly, the spacers 212 and 312 may be formed on the first and second gate electrodes 204 and 304 by forming a spacer layer (not shown) on a whole surface of the semiconductor substrate 100 so as to cover the first and second gate electrodes 204 and 304, and then anisotropically etching the spacer layer.

Figure 10:
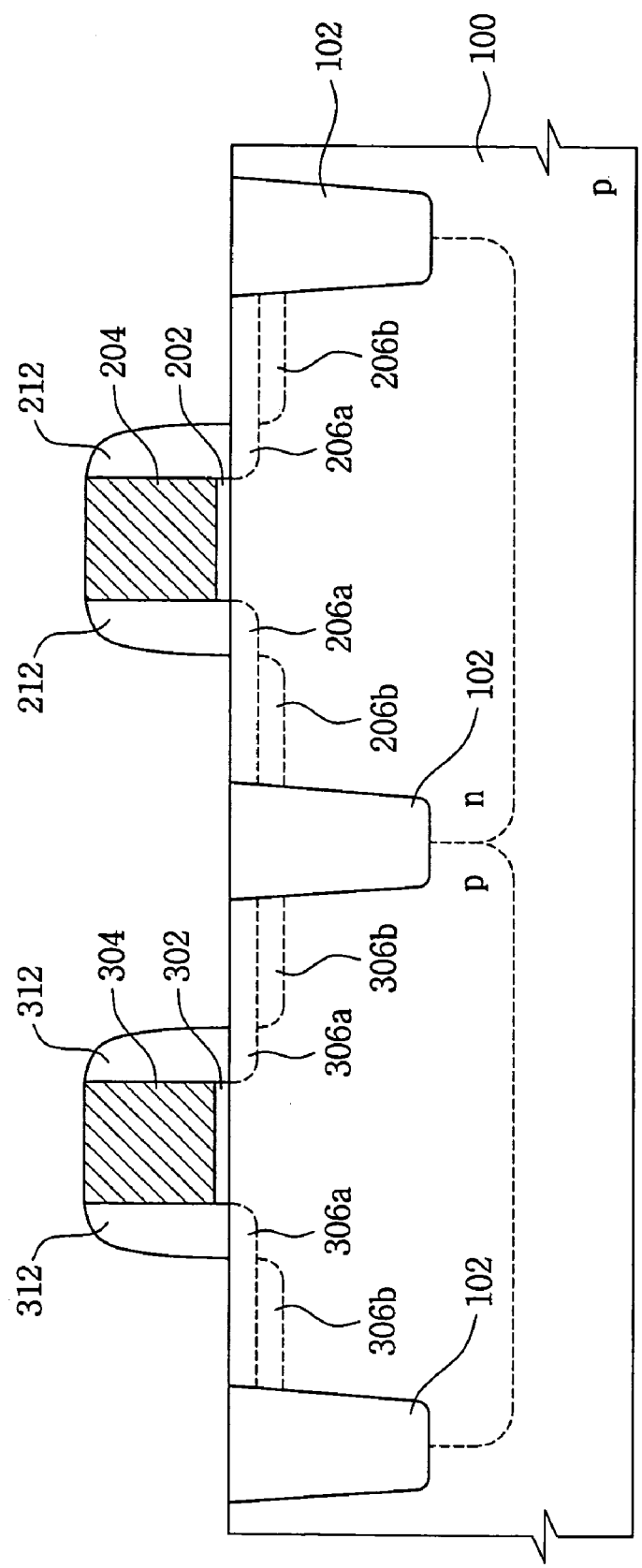

Referring to FIG. 10, a photoresist pattern (not shown) is formed on the active regions, and has an opening to expose the active region for the PMOSFET. P-type high density impurity regions 206b are formed at surface portions of the active region adjacent to the first gate electrode 204 by selectively implanting the p-type impurities, using the photoresist pattern, the first gate electrode 204 and the spacers 212 as an ion implant mask. The photoresist pattern is removed from the semiconductor substrate 100 after forming the p-type high density impurity regions 206b.

Similarly, a photoresist pattern (not shown) is formed on the active regions, and has an opening to expose the active region for the NMOSFET. N-type high density impurity regions 306b are formed at surface portions of the active region adjacent to the second gate electrode 304 by selectively implanting the n-type impurities, using the photoresist pattern, the second gate electrode 304 and the spacers 312 as an ion implant mask. The photoresist pattern is removed from the semiconductor substrate 100 after forming the n-type high density impurity regions 306b.

On the contrary, multi-layer spacers may be formed on the first and second gate electrodes 204 and 304. Each of the multi-layer spacers may include a screen oxide layer, a nitride spacer and an oxide spacer. The screen oxide layer may be formed while performing a re-oxidation process for curing the first and second gate insulating layers 202 and 302 damaged by an anisotropic etching for forming the first and second gate electrodes 204 and 304. The multi-layer spacers may be completed by sequentially forming a spacer nitride layer and a spacer oxide layer on the screen oxide layer and anisotropically etching the spacer oxide layer, the spacer nitride layer and the screen oxide layer. In addition, second n-type low density impurity regions and second p-type low density impurity regions may be formed after forming the screen oxide layer.

As above described, structures of the spacers 212 and 312 may be variably changed or modified, and thus the spirit and scope of the present invention are not limited by the structures of the spacers 212 and 312.

Figure 11:
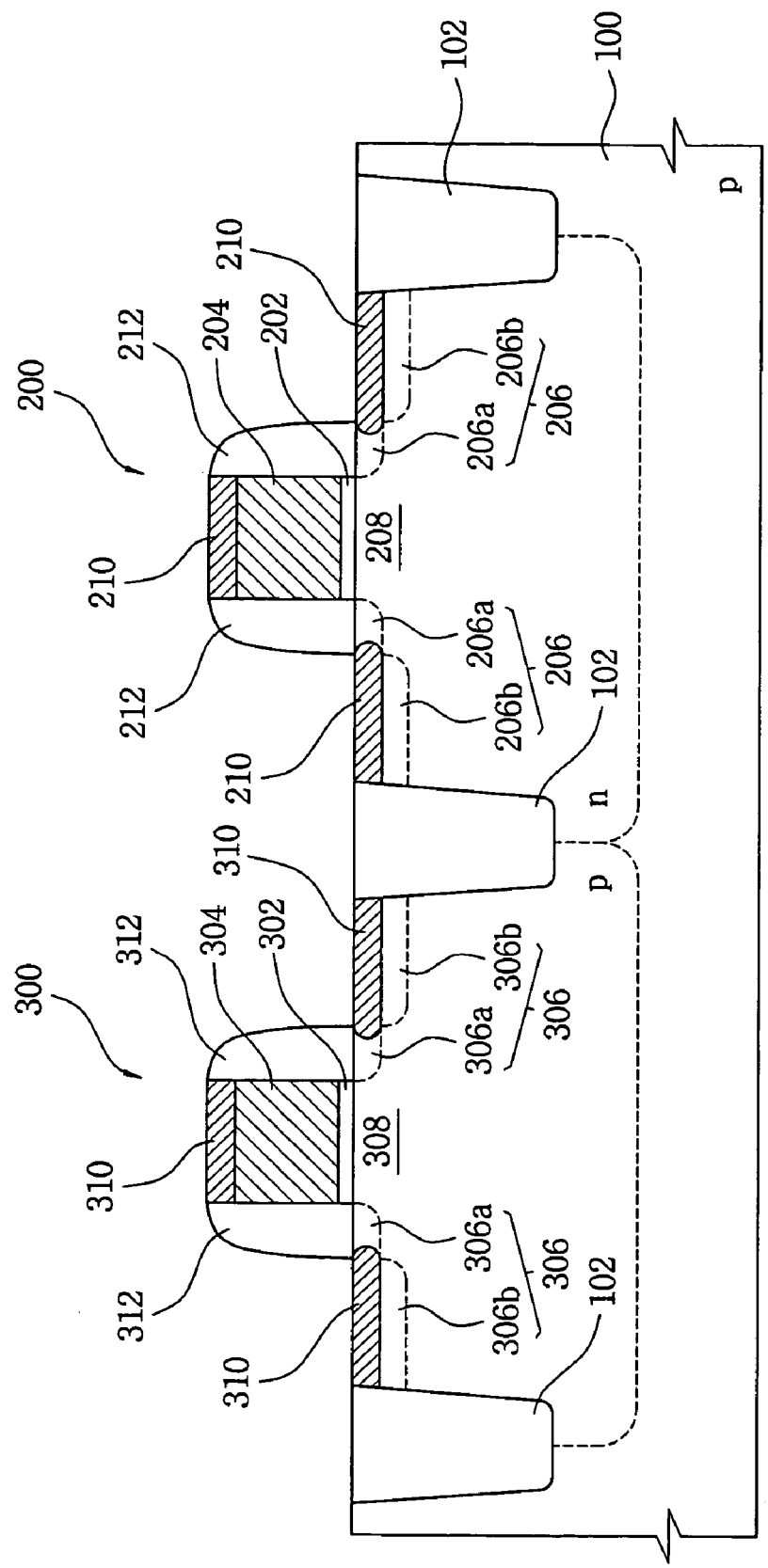

Referring to FIG. 11, metal silicide layers 210 and 310 are formed on top portions of the first and second gate electrodes 204 and 304 and surface portions of the p-type and n-type impurity regions 206 and 306. For example, cobalt silicide layers or titanium silicide layers may be formed on the top portions of the first and second gate electrodes 204 and 304 and the surface portions of the p-type and n-type impurity regions 206 and 306.

Particularly, a cobalt layer or a titanium layer is formed on a whole surface of the semiconductor substrate 100 using a sputtering process, and then a heat treatment process is performed in order to cause a silicidation reaction of the first and second gate electrodes 204 and 304 including the polysilicon and the p-type and n-type impurity regions 206 and 306 including the single crystal silicon with the cobalt layer or the titanium layer. Accordingly, the metal silicide layers 210 and 310 are formed in the top portions of the first and second gate electrodes 204 and 304 and the surface portions of the p-type and n-type impurity regions 206 and 306.

As a result, the PMOSFET 200 including the first gate insulating layer 202, the first gate electrode 204, the p-type impurity regions 206, the first channel region 208, the metal silicide layers 210 and the spacers 212, and the NMOSFET 300 including the second gate insulating 302, the second gate electrode 304, the n-type impurity regions 306, the second channel region 308, the metal silicide layers 310 and the spacers 312 are formed on the semiconductor substrate 100.

Figure 12:
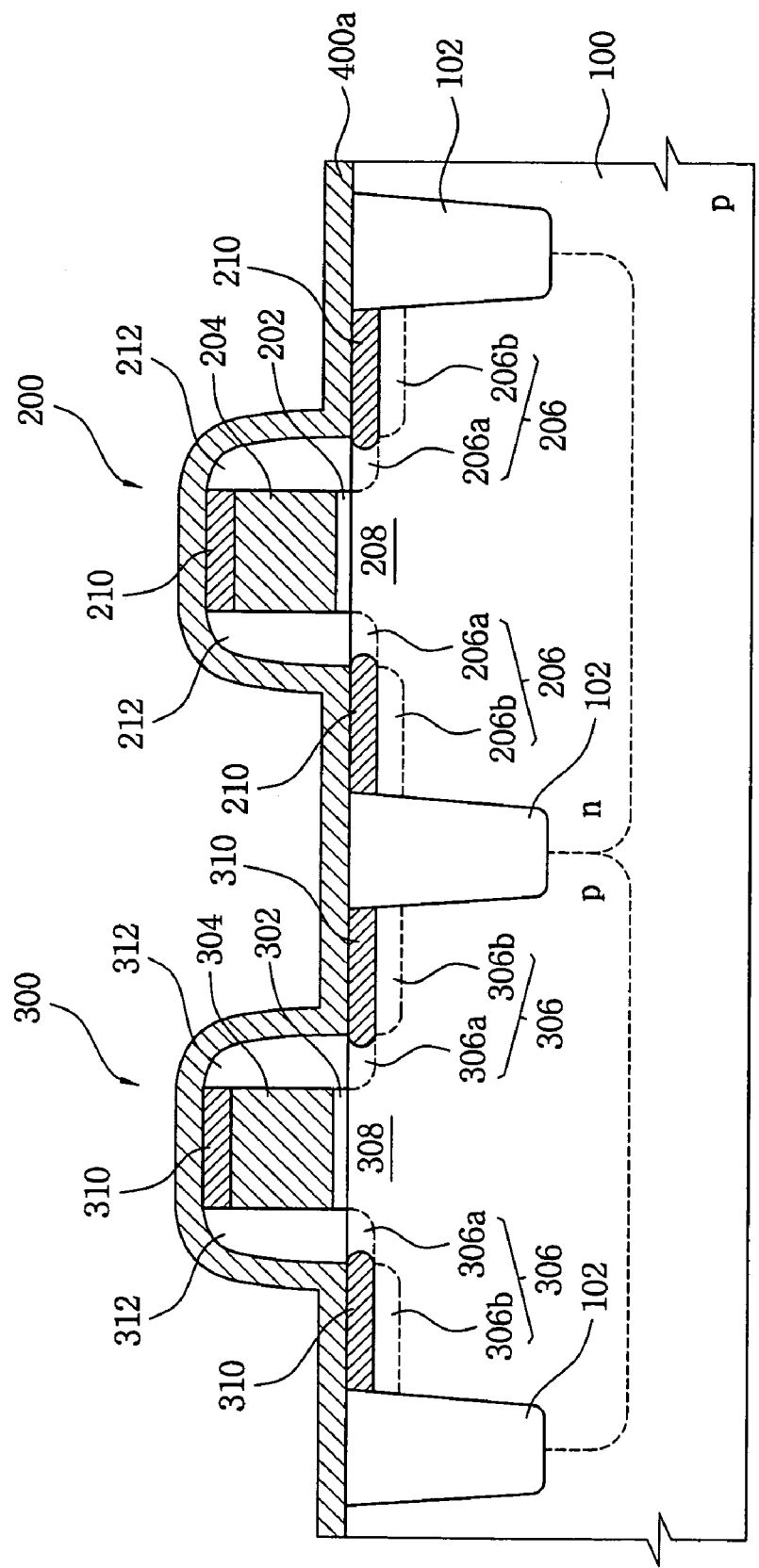

Referring to FIG. 12, a stress liner 400a including silicon nitride is successively formed on the PMOSFET 200 and the NMOSFET 300. Particularly, the stress liner 400a may be formed using a PECVD process and have a first compressive stress. The first compressive stress is generated by hydrogen (H) diffused into the stress liner while performing the PECVD process.

Figure 13:
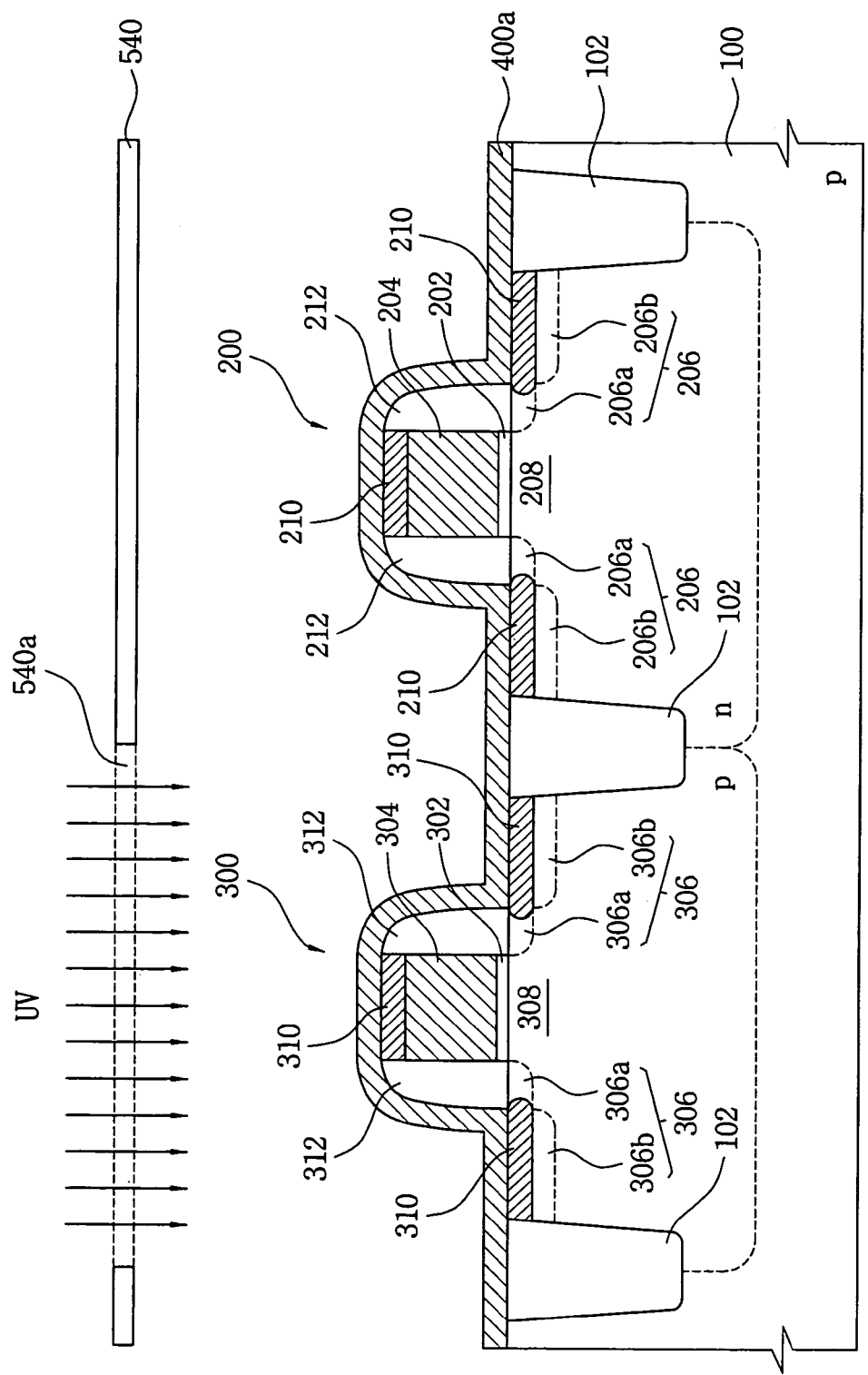

Referring to FIG. 13, a dual stress liner 400 may be formed on the PMOSFET 200 and the NMOSFET 300 by means of relaxing the first compressive stress of a portion of the stress liner 400a on the NMOSFET 300 to a second compressive stress smaller than the first stress. As a result, the dual stress liner 400 including a first liner portion 410 and a second liner portion 420, as shown in FIG. 6, is formed on the PMOSFET 200 and the NMOSFET 300.

The first compressive stress of the portion of the stress liner 400a on the NMOSFET 300 may be relaxed by selectively exposing the portion of the stress liner 400a on the NMOSFET 300 to ultraviolet light.

The selective ultraviolet light exposure process may be performed using a light exposure apparatus. The light exposure apparatus may include an illumination optical system including a light source for generating the ultraviolet light, a photomask 540 having a light transmitting section 540a corresponding to the portion of the stress liner 400a on the NMOSFET 300, a projection optical system for directing a projection light transmitted through the light transmitting section 540a onto the portion of the stress liner 400a on the NMOSFET 300, a stage for supporting the semiconductor substrate 100, a vacuum chamber in which the stage is positioned, or the like.

Meanwhile, the semiconductor substrate 100 may be heated for increasing stress relaxation efficiency. For example, the semiconductor substrate 100 may be heated to a temperature of about 400° C. to about 550° C. Particularly, the semiconductor substrate 100 may be heated to a temperature of about 450° C. or about 500° C.

Figure 14:
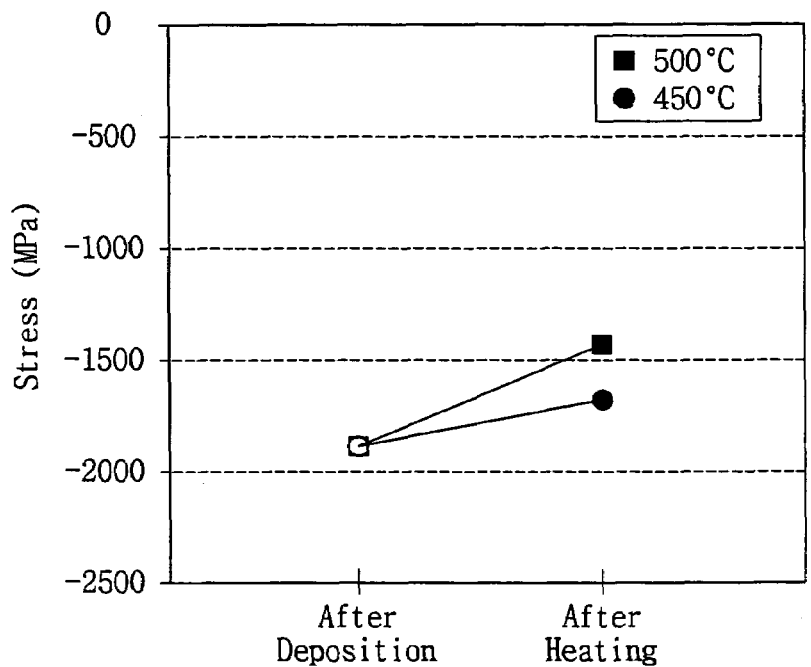
FIG. 14 is a graph illustrating compressive stress variation of a silicon nitride layer formed by a plasma enhanced chemical vapor deposition in accordance with a heating temperature.
Figure 15:
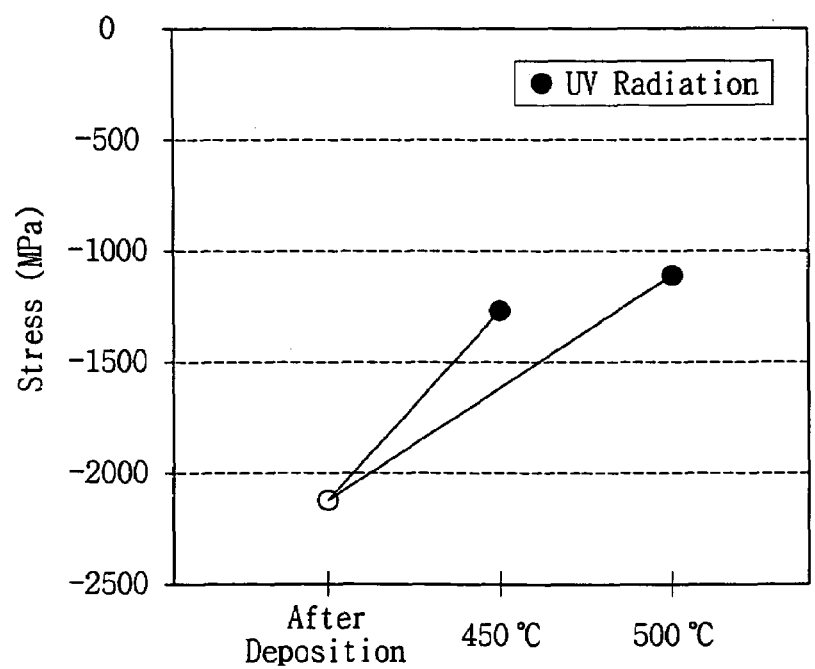
FIG. 15 is a graph illustrating compressive stress variation of a silicon nitride layer formed by a plasma enhanced chemical vapor deposition in accordance with a heating temperature and an ultraviolet light exposure.

FIG. 14 is a graph illustrating compressive stress variation of a silicon nitride layer formed by a plasma enhanced chemical vapor deposition in accordance with a heating temperature, and FIG. 15 is a graph illustrating compressive stress variation of a silicon nitride layer formed by a plasma enhanced chemical vapor deposition in accordance with a heating temperature and an ultraviolet light exposure.

Primarily, a first silicon nitride layer was formed on a semiconductor substrate using the PECVD process, and then a heat treatment was performed at a temperature of about 450° C. for about 15 minutes. Furthermore, a second silicon nitride layer was formed on a semiconductor substrate using the PECVD process, and then a heat treatment was performed at a temperature of about 500° C. for about 15 minutes.

Referring to FIG. 14, compressive stress of the first silicon nitride layer was reduced by about 10 percent, and compressive stress of the second silicon nitride layer was reduced by about 20 percent. However, when the heating temperature is higher than about 550° C., thermal stress may be applied to MOSFETs formed on the substrate. When the heating temperature is lower than about 400° C., the compressive stress may be not relaxed.

On the contrary, a third silicon nitride layer was formed on a semiconductor substrate using the PECVD process, and then the third silicon nitride layer was exposed to ultraviolet light having a wavelength of 257 nm at a temperature of about 450° C. for about 5 minutes. Furthermore, a fourth silicon nitride layer was formed on a semiconductor substrate using the PECVD process, and then the fourth silicon nitride layer was exposed to ultraviolet light having a wavelength of 257 nm at a temperature of about 450° C. for about 5 minutes.

Referring to FIG. 15, when simultaneously performing the heat treatment process and the ultraviolet light exposure process on the silicon nitride layer(s) formed by the PECVD process, compressive stress of the silicon nitride layer(s) was remarkably reduced.

Ultraviolet light radiation may dissociate nitrogen-hydrogen bonds and/or silicon-hydrogen bonds, and then the dissociated hydrogen may be removed from the silicon nitride layer(s) by a vacuum force. Thus, the compressive stress of the silicon nitride layer(s) may be reduced.

Figure 16:
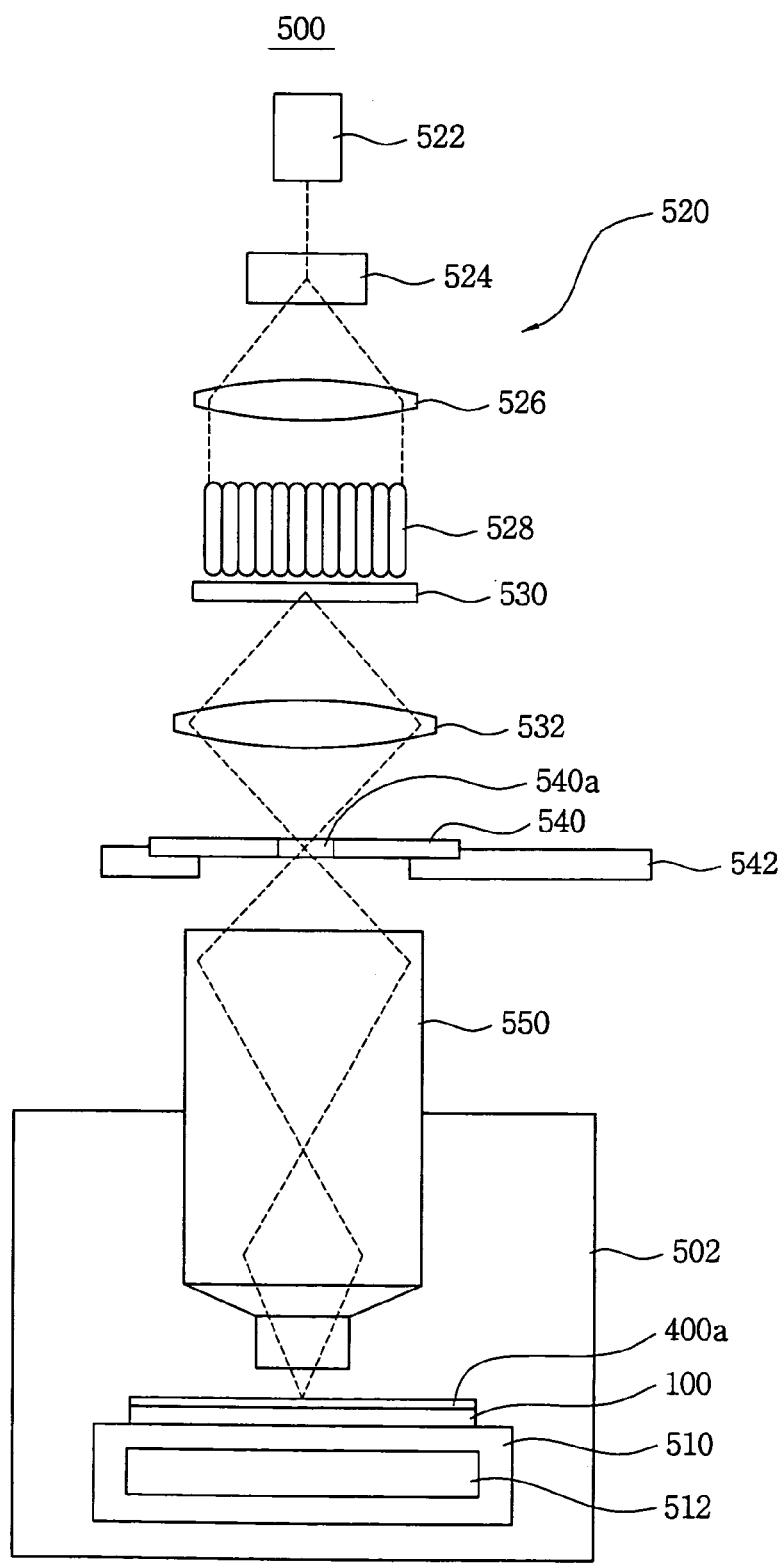
FIG. 16 is a schematic view illustrating a light exposure apparatus for forming the dual stress liner as shown in FIG. 6.

FIG. 16 is a schematic view illustrating a light exposure apparatus for forming the dual stress liner as shown in FIG. 6.

Referring to FIG. 16, a light exposure apparatus 500 may include a stage 510, an illumination optical system 520, a photomask 540 and a projection optical system 550.

The stage 510 is provided for supporting a semiconductor substrate 100 on which a stress liner 400a having a first compressive stress is formed. Particularly, a PMOSFET 200 and an NMOSFET 300 (referring to FIG. 6) are formed on the semiconductor substrate 100, and the stress liner 400a is formed on the PNOSFET 200 and the NMOSFET 300.

The photomask 540 has a light transmitting section 540a corresponding to a portion of the stress liner 400a on the NMOSFET 300.

The illumination optical system 520 is provided for illuminating the photomask 540 with an illumination light, and the projection optical system 550 is provided for exposing the portion of the stress liner 400a on the NMOSFET 300 to a projection light transmitted through the light transmitting section 540a so that the portion of the stress liner 400a on the NMOSFET 300 has a second compressive stress smaller than the first compressive stress.

Furthermore, the light exposure apparatus 500 may include a heater 512 for heating the semiconductor substrate 100 and a vacuum chamber 502 in which the stage 510 is positioned.

The illumination light may include an ultraviolet light. For example, deep-ultraviolet light or mid-ultraviolet light may be used as the illumination light. Particularly, the ultraviolet light has a wavelength of 157 nm, 193 nm, 248 nm, 257 nm, 365 nm, or the like.

The illumination optical system 520 may include a light source 522 for generating the ultraviolet light, a beam expander 524 for expanding the ultraviolet light, a collimator lens 526 for collimating the expanded ultraviolet light, a fly eye lens 528 for uniformizing the collimated ultraviolet light, an aperture plate 530 for transmitting the uniformized ultraviolet light, a condensing lens 532 for condensing the ultraviolet light transmitted through aperture plate 530 onto the photomask 540, or the like.

Examples of the light source 522 may include a mercury-xenon lamp for generating a light beam of 365 nm wavelength, a krypton ion laser or argon ion laser for generating a light beam of 257 nm wavelength, a KrF excimer laser for generating a light beam of 248 nm wavelength, an ArF excimer laser for generating a light beam of 193 nm wavelength, an $F_2$ laser for generating a light beam of 157 nm wavelength, or the like.

The photomask 540 is supported by a mask stage 542, and the projection light transmitted through the photomask 540 is irradiated onto the portion of the stress liner 400a on the NMOSFET 300 through the projection optical system 550.

The heater 512 for heating the semiconductor substrate 100 may be disposed in the stage 510, and the stage 510 is movably disposed in the vacuum chamber. Though not shown in figures, the vacuum chamber 502 may be connected to a vacuum system for evacuating the vacuum chamber 502.

Meanwhile, the ultraviolet light exposure process may be performed in a stepping manner or in a scanning manner, and constituent elements of the light exposure apparatus 500 are substantially identical to those of a conventional light exposure apparatus except for the heater 512 in the stage 510 and the photomask 540. That is, the spirit and scope of the present invention are not limited by the different elements except for the heater 512 and the photomask 540.

According to the exemplary embodiments of the present invention, the dual stress liner may be formed by the formation of the stress liner and the selective ultraviolet light exposure. Thus, processing steps for forming the dual stress liner may be simplified, and thus the time required for forming the dual stress liner may be reduced. Consequently, the productivity of the semiconductor device having the dual stress liner may be improved.

Although exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:
1. A method of manufacturing a semiconductor device comprising:

forming a PMOSFET and an NMOSFET on a substrate; and forming a dual stress liner including a first portion having a first stress and a second portion having a second stress smaller than the first stress on the PMOSFET and the NMOSFET, wherein the first portion is formed on the PMOSFET, and the second portion is formed on the NMOSFET, wherein the forming the dual stress liner comprises:

forming a stress liner on the PMOSFET and the NMOSFET; and relaxing a stress of a portion of the stress liner formed on the NMOSFET; and wherein the stress of the portion of the stress liner on the NMOSFET is relaxed by selectively exposing the portion of the stress liner on the NMOSFET to an ultraviolet light.

2. The method of claim 1, wherein the stress liner is formed by a plasma enhanced chemical vapor deposition process.

3. The method of claim 1, wherein the relaxing the stress is performed using a light exposure apparatus having a photomask for selectively exposing the portion of the stress liner on the NMOSFET to the ultraviolet light.

4. The method of claim 1, further comprising heating the substrate while exposing the portion of the stress liner on the NMOSFET to the ultraviolet light.

5. The method of claim 4, wherein the substrate is heated to a temperature of about 400° C. to about 550° C.

6. The method of claim 1, wherein the relaxing the stress is performed in a vacuum chamber.

7. The method of claim 1, wherein the dual stress liner comprises silicon nitride.

8. A method of manufacturing a semiconductor device comprising:

forming a PMOSFET and an NMOSFET on a substrate;

forming a stress liner having a first stress on the PMOSFET and the NMOSFET; and selectively exposing a portion of the stress liner on the NMOSFET to an ultraviolet light so that the portion of the stress liner on the NMOSFET has a second stress smaller than the first stress.

9. The method of claim 8, wherein the stress liner comprises silicon nitride.

10. The method of claim 9, wherein the silicon nitride is formed by a plasma enhanced chemical vapor deposition process.

11. The method of claim 8, further comprising heating the substrate.

12. The method of claim 11, wherein the heating the substrate is performed along with the selectively exposing the portion of the stress liner on the NMOSFET to the ultraviolet light.

* * * * *